US012635392B2

(12) United States Patent
Ryu et al.

(10) Patent No.: US 12,635,392 B2
(45) Date of Patent: May 19, 2026

(54) DISPLAY APPARATUS

(71) Applicant: Samsung Display Co., Ltd., Yongin-si (KR)

(72) Inventors: Soohye Ryu, Yongin-si (KR); Hongjo Park, Yongin-si (KR); Eunggyu Lee, Yongin-si (KR); Beohmrock Choi, Yongin-si (KR)

(73) Assignee: Samsung Display Co., LTD., Gyeonggi-Do (KR)

( * ) Notice: Subject to any disclaimer, the term of this patent is extended or adjusted under 35 U.S.C. 154(b) by 711 days.

(21) Appl. No.: 17/941,145

(22) Filed: Sep. 9, 2022

(65) Prior Publication Data

US 2023/0200124 A1 Jun. 22, 2023

(30) Foreign Application Priority Data

Dec. 22, 2021 (KR) ........................ 10-2021-0185415

(51) Int. Cl.

| | |
|---|---|
| ***H10K 59/40*** | (2023.01) |
| ***H10K 50/84*** | (2023.01) |
| ***H10K 50/844*** | (2023.01) |
| ***H10K 50/85*** | (2023.01) |
| ***H10K 59/38*** | (2023.01) |
| ***H10K 59/80*** | (2023.01) |

(52) U.S. Cl.

CPC ......... *H10K 59/877* (2023.02); *H10K 50/844* (2023.02); *H10K 59/38* (2023.02); *H10K 59/40* (2023.02); *H10K 59/879* (2023.02); *H10K 59/8792* (2023.02)

(58) Field of Classification Search

CPC .. H10K 50/844; H10K 50/858; H10K 50/841; H10K 50/8445; H10K 50/854; H10K 59/877; H10K 59/38; H10K 59/40; H10K 59/879; H10K 59/8792; H10K 59/12; H10K 59/352; H10K 59/353

See application file for complete search history.

(56) References Cited

U.S. PATENT DOCUMENTS

| | | | |
|---|---|---|---|
| 8,970,108 | B2 | 3/2015 | Park et al. |
| 9,257,675 | B2 | 2/2016 | Jang et al. |
| 10,714,710 | B2 | 7/2020 | Woo et al. |
| 10,971,557 | B2 | 4/2021 | Jeong et al. |
| 11,199,918 | B2 | 12/2021 | Kim |

(Continued)

FOREIGN PATENT DOCUMENTS

| | | |
|---|---|---|
| KR | 20130134919 A | 12/2013 |
| KR | 10-1427453 | 8/2014 |

(Continued)

*Primary Examiner* — Omar F Mojaddedi

(74) *Attorney, Agent, or Firm* — Harness, Dickey & Pierce, P.L.C.

(57) ABSTRACT

A display apparatus includes a display element disposed over a substrate, a light blocking layer disposed over the display element, the light blocking layer including an opening corresponding to the display element, a first high-refraction layer disposed in the opening of the light blocking layer, a first low-refraction layer overlapping the light blocking layer and the first high-refraction layer in a plan view, the first low-refraction layer having a refractive index that is lower than a refractive index of the first high-refraction layer, and scattering particles disposed over the display element.

6 Claims, 12 Drawing Sheets

(56) References Cited

U.S. PATENT DOCUMENTS

| | | | | |
|---|---|---|---|---|
| 11,672,143 | B2 | 6/2023 | Choi et al. | |
| 12,200,963 | B2 | 1/2025 | Shimatsu | |
| 12,250,844 | B2 | 3/2025 | Oh et al. | |
| 12,356,839 | B2 | 7/2025 | Lee et al. | |
| 2011/0042697 | A1* | 2/2011 | Lee | H10K 59/877 257/89 |
| 2018/0061894 | A1* | 3/2018 | Kim | H10K 59/873 |
| 2020/0058904 | A1* | 2/2020 | Kim | H10K 59/877 |
| 2020/0075682 | A1* | 3/2020 | Jeong | H10K 59/38 |
| 2020/0105826 | A1* | 4/2020 | Kim | H01L 25/0753 |
| 2020/0243802 | A1* | 7/2020 | Ju | H10K 59/38 |
| 2020/0335723 | A1 | 10/2020 | Yuan et al. | |
| 2020/0365833 | A1 | 11/2020 | Joo et al. | |
| 2022/0002574 | A1 | 1/2022 | Guschl et al. | |
| 2023/0309365 | A1* | 9/2023 | Zhu | H10K 59/122 |

FOREIGN PATENT DOCUMENTS

| | | | |
|---|---|---|---|
| KR | 20170066738 | A | 6/2017 |
| KR | 20180021342 | A | 3/2018 |
| KR | 20190047993 | A | 5/2019 |
| KR | 10-2020-0025980 | | 3/2020 |
| KR | 20200078796 | A | 7/2020 |
| KR | 20200083875 | A | 7/2020 |
| KR | 10-2020-0133086 | | 11/2020 |
| KR | 10-2021-0031415 | | 3/2021 |
| KR | 20210055858 | A | 5/2021 |
| KR | 10-2021-0080564 | | 6/2021 |
| KR | 20210125480 | A | 10/2021 |

* cited by examiner

DISPLAY APPARATUS

CROSS-REFERENCE TO RELATED APPLICATION(S)

This application claims priority to and benefits of Korean Patent Application No. 10-2021-0185415 under 35 U.S.C. § 119, filed on Dec. 22, 2021, in the Korean Intellectual Property Office, the entire contents of which are incorporated herein by reference.

BACKGROUND

1. Technical Field

The embodiments relate to a display apparatus capable of reducing the occurrence of a color band due to reflection of light on an electrode of a display element or the like.

2. Description of the Related Art

An electrode of a display element included in a display apparatus and other metal lines thereof reflect a variety of light. When there is an external light source, they reflect light introduced into the display apparatus from outside the display apparatus. When light is generated from an emission layer of the display element, electrodes and other metal lines reflect a portion of light generated from the emission layer of the display element.

A limitation when electrodes and other metal lines reflect light is that a color band may be visible as light generated from an emission layer of a display element is reflected by an electrode of the display element or the like.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

In order to address problems including those above, the embodiments include a display apparatus capable of reducing the occurrence of a color band due to reflection from an electrode of a display element or the like. However, problems addressed are examples, and the scope of the disclosure is not limited thereto.

Additional aspects will be set forth in part in the description which follows and, in part, will be apparent from the description, or may be learned by practice of the embodiments of the disclosure.

According to tan embodiment, a display apparatus may include a display element disposed over a substrate, a light blocking layer disposed over the display element, the light blocking layer including an opening corresponding to the display element, a first high-refraction layer disposed in the opening of the light blocking layer, a first low-refraction layer covering the light blocking layer and the first high-refraction layer, the first low-refraction layer having a refractive index lower than a refractive index of the first high-refraction layer, and scattering particles disposed over the display element.

An average diameter of the scattering particles may be about 0.8 μm to about 3.0 μm.

The scattering particles may be disposed in the first high-refraction layer.

The display apparatus may further include an encapsulation layer disposed between the display element and the light blocking layer.

The scattering particles may be disposed in the encapsulation layer.

The encapsulation layer may include a first inorganic encapsulation layer, an organic encapsulation layer disposed on the first inorganic encapsulation layer, and a second inorganic encapsulation layer that overlaps the organic encapsulation layer in a plan view. The scattering particles may be disposed in the organic encapsulation layer.

The display apparatus may include an input sensing layer disposed between the encapsulation layer and the light blocking layer, the input sensing layer including a sensing electrode and a touch insulating layer.

The scattering particles may be disposed in the touch insulating layer.

The display apparatus may further include a low-reflection layer disposed between the display element and the encapsulation layer.

The display apparatus may further include an adhesive layer disposed over the first low-refraction layer.

The scattering particles may be disposed in the adhesive layer.

The display apparatus may further include a protection layer disposed over the adhesive layer.

The scattering particles may be disposed in the protection layer.

According to an embodiment, a display apparatus may include a display element disposed over a substrate, a light blocking layer disposed over the display element. the light blocking layer including an opening corresponding to the display element, a color filter layer filling the opening of the light blocking layer, a color filter planarization layer overlapping the color filter layer in a plan view, and scattering particles disposed over the display element.

The scattering particles may be disposed in the color filter layer.

The scattering particles may be disposed in the color filter planarization layer.

An average diameter of the scattering particles may be about 0.8 μm to about 3.0 μm.

The display apparatus may further include a second low-refraction layer disposed over the planarization layer, the second low-refraction layer including an opening corresponding to the display element, and a second high-refraction layer filling the opening of the second low-refraction layer, the second high-refraction layer having a refractive index that is higher than a refractive index of the second low-refraction layer.

The second high-refraction layer may include high-refraction particles having an average diameter of about 20 nm to about 30 nm.

The scattering particles may be disposed in the second high-refraction layer.

Other aspects, features, and advantages other than those described above will become apparent from the following detailed description, the appended claims, and the accompanying drawings.

BRIEF DESCRIPTION OF THE DRAWINGS

The above and other aspects of the disclosure will be more apparent by describing in detail embodiments thereof with reference to the attached drawings, in which.

DETAILED DESCRIPTION OF THE EMBODIMENTS

Figure 1:
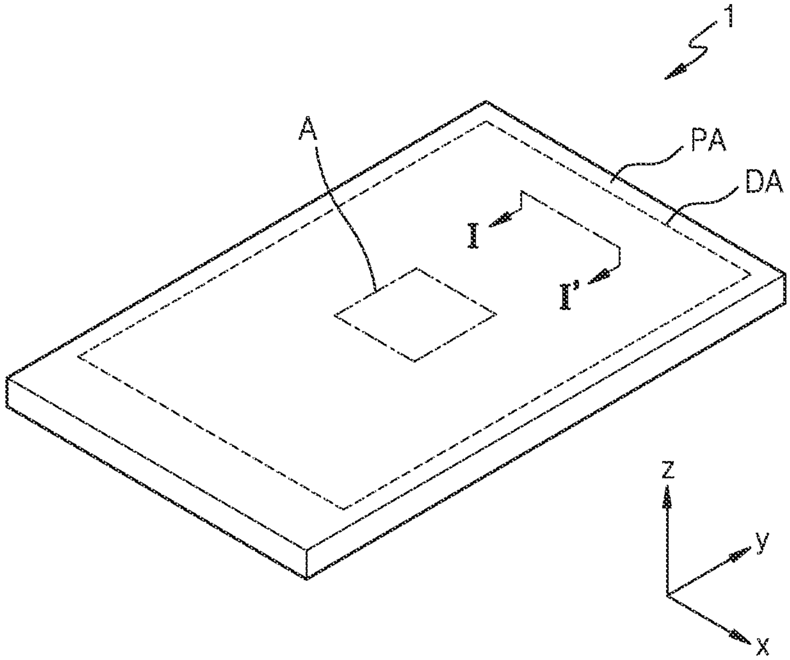
FIG. 1 is a schematic perspective view illustrating a display apparatus according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

Hereinafter, embodiments will be described in detail with reference to the accompanying drawings, and in the following description, like reference numerals will denote like elements and redundant descriptions thereof will be omitted for conciseness.

It will be understood that when an element such as a layer, a region, or a plate is referred to as being "on" another element, it may be "directly on" the element or may be "indirectly on" the other element with one or more intervening elements therebetween.

In the drawings, sizes, thicknesses, ratios, and dimensions of the elements may be exaggerated for ease of description and for clarity. Like numbers refer to like elements throughout.

The x axis, the y axis, and the z axis are not limited to three axes of the rectangular coordinate system and may be interpreted in a broader sense. For example, the x axis, the y axis, and the z axis may be perpendicular to one another or may represent different directions that are not perpendicular to one another.

It will be understood that although terms such as "first" and "second" may be used herein to describe various elements, these elements should not be limited by these terms and these terms are only used to distinguish one element from another element.

As used herein, the singular forms "a," "an," and "the" are intended to include the plural forms as well, unless the context clearly indicates otherwise.

It will be understood that terms such as "comprise," "include," and "have" used herein specify the presence of stated features or elements, but do not preclude the presence or addition of one or more other features or elements.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will be understood that, although the terms first, second, etc., may be used herein to describe various elements, these elements should not be limited by these terms. These terms are only used to distinguish one element from another element. For example, a first element may be referred to as a second element, and similarly, a second element may be referred to as a first element without departing from the scope of the disclosure.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

"About," "substantially," or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic perspective view illustrating a display apparatus 1 according to an embodiment.

As illustrated in FIG. 1, the display apparatus 1 may include a display area DA and a peripheral area PA surrounding the display area DA. The display apparatus 1 may provide an image through an array of pixels two-dimensionally arranged in the display area DA.

Each pixel of the display apparatus 1 may be an area capable of emitting light of a certain color, and the display apparatus 1 may provide an image by using light emitted from the pixels. For example, each pixel may emit red light, green light, or blue light.

The display area DA may have a polygonal shape including a tetragonal shape as illustrated in FIG. 1. For example, the display area DA may have a rectangular shape in which the horizontal length is greater than the vertical length, may have a rectangular shape in which the horizontal length is less than the vertical length, or may have a square shape. In other examples, the display area DA may have various shapes such as an elliptical shape or a circular shape.

The peripheral area PA may be an area not providing an image and may entirely surround the display area DA. A driver or a main power line for providing an electrical signal or power to pixel circuits may be arranged in the peripheral area PA. The peripheral area PA may include a pad that is an area to which an electronic element or a printed circuit board may be electrically connected.

Hereinafter, an organic light emitting display apparatus will be described as an example of the display apparatus 1 according to an embodiment; however, the display apparatus 1 of the disclosure is not limited thereto. In other examples, the display apparatus 1 of the disclosure may be an inorganic light emitting display apparatus (or an inorganic electroluminescence (EL) display apparatus) or may be a display apparatus such as a quantum dot light emitting display apparatus. For example, an emission layer of a display element included in the display apparatus 1 may include an organic material or may include an inorganic material. The display apparatus 1 may include an emission layer and quantum dots located on the path of light emitted from the emission layer.

Figure 2:
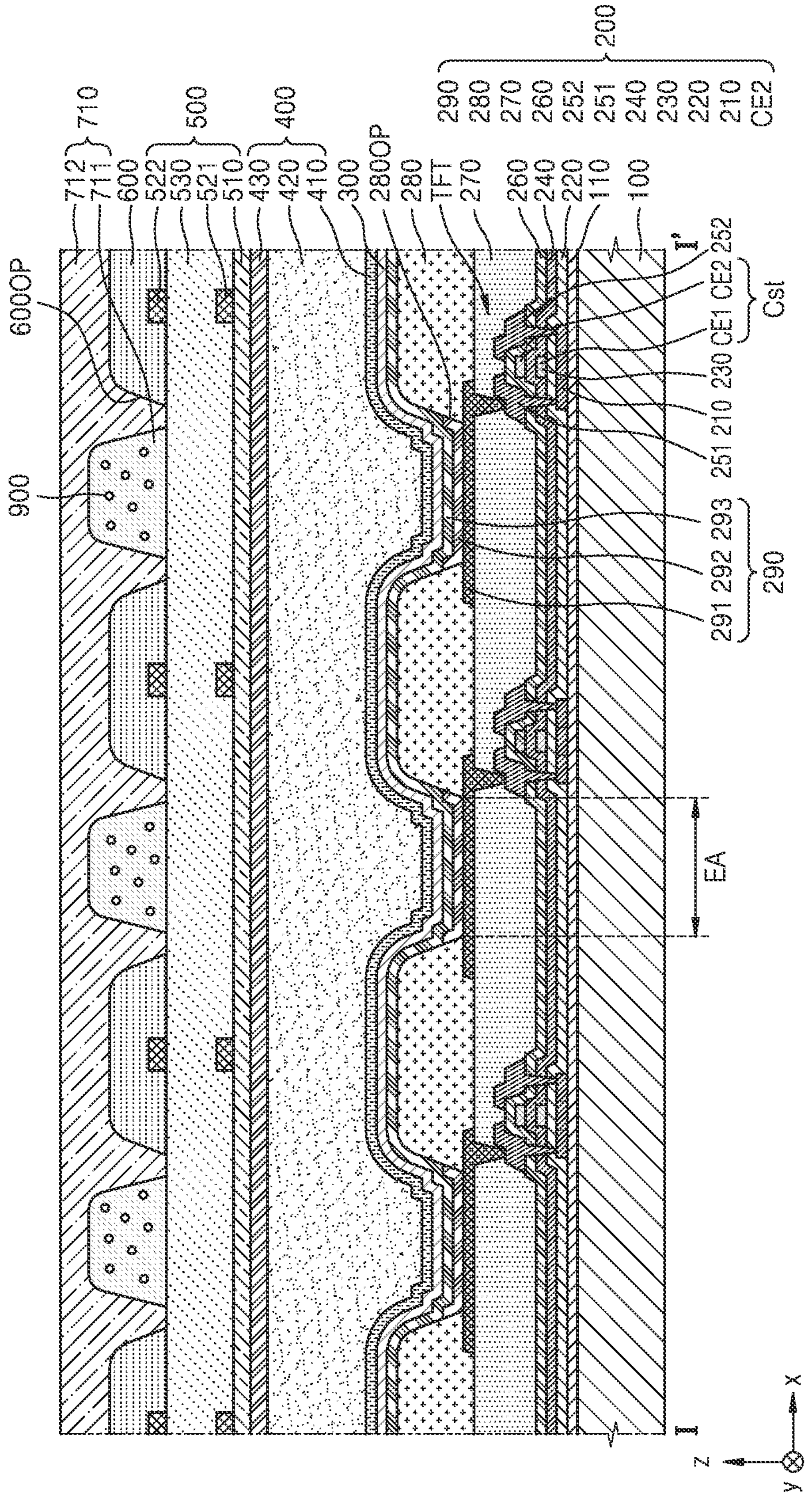
FIG. 2 is a schematic cross-sectional view of the display apparatus taken along line I-I' of FIG. 1.

FIG. 2 is a schematic cross-sectional view illustrating a portion of the display apparatus 1 taken along line I-I' of FIG. 1 according to an embodiment.

As illustrated in FIG. 2, the display apparatus 1 may include a substrate 100, a display element layer 200, a low-reflection layer 300, an encapsulation layer 400, an input sensing layer 500, and a first refraction layer 710.

The substrate 100 may include glass, metal, or polymer resin. The substrate 100 may be flexible or bendable. The substrate 100 may include, for example, a polymer resin such as polyethersulphone, polyacrylate, polyetherimide, polyethylene naphthalate, polyethylene terephthalate, polyphenylene sulfide, polyarylate, polyimide, polycarbonate, or cellulose acetate propionate. The substrate 100 may be modified such as including a multilayer structure including two layers including the polymer resin and a barrier layer interposed (disposed) between the two layers and including an inorganic material (e.g., silicon oxide, silicon nitride, or silicon oxynitride).

A buffer layer 110 including silicon oxide, silicon nitride, or silicon oxynitride may be disposed on the substrate 100. The buffer layer 110 may increase the smoothness of the upper surface of the substrate 100, and the buffer layer 110 may prevent a phenomenon in which metal atoms or impurities are diffused from the substrate 100 to a semiconductor layer 210 located thereover. The buffer layer 110 may be a single layer or multiple layers including silicon oxide, silicon nitride, or silicon oxynitride.

The display element layer 200 may be disposed on the buffer layer 110. The display element layer 200 may include a display element 290 and a thin film transistor TFT and a storage capacitor Cst to which the display element 290 is electrically connected. FIG. 2 illustrates that an organic light emitting element is located as the display element 290 over the buffer layer 110. When the organic light emitting element is referred to as being electrically connected to the thin film transistor TFT, a pixel electrode 291 of the organic light emitting element may be electrically connected to the thin film transistor TFT.

As illustrated in FIG. 2, the thin film transistor TFT may include a semiconductor layer 210 including amorphous silicon, polycrystalline silicon, an oxide semiconductor material, or an organic semiconductor material, a gate electrode 230, a source electrode 251, and a drain electrode 252. In order to secure the insulation between the semiconductor layer 210 and the gate electrode 230, a gate insulating layer 220 including an inorganic material such as silicon oxide, silicon nitride, and/or silicon oxynitride may be interposed (disposed) between the semiconductor layer 210 and the gate electrode 230. A first interlayer insulating layer 240 including an inorganic material such as silicon oxide, silicon nitride, and/or silicon oxynitride may be disposed over the gate electrode 230. The first interlayer insulating layer 240 may include a single layer or multiple layers including the above material. As such, an insulating layer including an inorganic material may be formed through chemical vapor deposition (CVD) or atomic layer deposition (ALD). This may also apply to the following embodiments and modifications thereof.

The storage capacitor Cst may include a first electrode CE1 and a second electrode CE2 overlapping each other in a plan view with the first interlayer insulating layer 240 therebetween. The storage capacitor Cst may overlap the thin film transistor TFT in a plan view. FIG. 2 illustrates that the gate electrode 230 of the thin film transistor TFT is the first electrode CE1 of the storage capacitor Cst; however, the disclosure is not limited thereto. For example, the storage capacitor Cst may not overlap the thin film transistor TFT. The second electrode CE2 of the storage capacitor Cst may include a conductive material including molybdenum (Mo), aluminum (Al), copper (Cu), titanium (Ti), or the like and may include a single layer or multiple layers including the above material.

A second interlayer insulating layer 260 including an inorganic material such as silicon oxide, silicon nitride, and/or silicon oxynitride may be disposed over the second electrode CE2 of the storage capacitor Cst. The second interlayer insulating layer 260 may include a single layer or multiple layers including the above material.

The source electrode 251 and the drain electrode 252 may be disposed on the second interlayer insulating layer 260. The source electrode 251 and the drain electrode 252 may include a material having high conductivity. The source electrode 251 and the drain electrode 252 may include a conductive material including molybdenum (Mo), aluminum (Al), copper (Cu), titanium (Ti), or the like and may include a single layer or a multiple layer including the above material. For example, the source electrode 251 and the drain electrode 252 may include a multilayer of Ti/Al/Ti.

A planarization layer 270 may be disposed on the thin film transistor TFT. For example, when the organic light emitting element is disposed over the thin film transistor TFT as illustrated in FIG. 2, the planarization layer 270 may generally planarize the upper portion of the thin film transistor TFT. The planarization layer 270 may include, for example, an organic material such as acryl, benzocyclobutene (BCB), or hexamethyldisiloxane (HMDSO). In FIG. 2, the planarization layer 270 is illustrated as a single layer; however, the planarization layer 109 may be variously modified such as including multiple layers.

In the display area DA of the display element layer 200, the display element 290 may be disposed on the planarization layer 270. The display element 290 may be, for example, an organic light emitting element including a pixel electrode 291, an opposite electrode 293, and an intermediate layer 292 disposed therebetween and including an emission layer.

As illustrated in FIG. 2, the pixel electrode 291 may be electrically connected to the thin film transistor TFT by contacting any one of the source electrode 251 and the drain electrode 252 through an opening portion formed in the planarization layer 270 or the like. The pixel electrode 291 may include a transparent conductive layer formed of a transparent conductive oxide such as ITO, $In_2O_3$, or IZO, and a reflection layer formed of a metal such as Al or Ag. For example, the pixel electrode 291 may have a three-layer structure of ITO/Ag/ITO. Accordingly, a portion of the light generated from the emission layer of the display element 290 may propagate to the outside after being reflected by the pixel electrode 291, and a portion of the light generated from the emission layer of the display element 290 may propagate to the outside without being reflected by the pixel electrode 291.

A pixel definition layer 280 may be disposed over the planarization layer 270. The pixel definition layer 280 may define a pixel by including a first opening 280OP corresponding to each pixel, for example, a first opening 280OP through which at least a center portion of the pixel electrode 291 is exposed. In FIG. 2, the pixel definition layer 280 may prevent the occurrence of an arc or the like at the edge of the pixel electrode 291 by increasing the distance between the edge of the pixel electrode 291 and the opposite electrode 293 over the pixel electrode 291. The pixel definition layer 280 may include, for example, an organic material such as polyimide or hexamethyldisiloxane (HMDSO).

Moreover, the pixel definition layer 280 may include a light blocking material and may be provided in black. The light blocking material may include a resin or paste including carbon black, carbon nanotube, or black dye, metal particles (e.g., nickel, aluminum, molybdenum, or any alloy thereof), metal oxide particles (e.g., chromium oxide), or metal nitride particles (e.g., chromium nitride). When the pixel definition layer 280 includes the light blocking material, the reflection of external light by metal structures disposed under the pixel definition layer 280 may be reduced.

The intermediate layer 292 of the organic light emitting element may include a low molecular weight or high molecular weight material. When the intermediate layer 292 includes a low molecular weight material, the intermediate layer 292 may include a structure in which a hole injection layer (HIL), a hole transport layer (HTL), an emission layer (EML), an electron transport layer (ETL), an electron injection layer (EIL), and the like are stacked in a single or complex structure and may be formed by vacuum deposition. When the intermediate layer 292 includes a high molecular weight material, the intermediate layer 292 may include a structure including an HTL and an EML. The HTL may include poly(3,4-ethylenedioxythiophene) (PEDOT) and the emission layer may include a high molecular weight material such as polyphenylene vinylene (PPV) and polyfluorene. The intermediate layer 292 may be formed by screen printing, inkjet printing, laser induced thermal imaging (LITI), or the like. However, the intermediate layer 292 is not limited thereto and may include various structures. The intermediate layer 292 may include a layer integrated over pixel electrodes 291 or may include a layer patterned to correspond to each of the pixel electrodes 291.

The opposite electrode 293 may be disposed over the display area DA and may be disposed to cover (or overlap in a plan view) the display area DA. For example, the opposite electrode 293 may be integrally formed in organic light emitting elements to correspond to pixel electrodes 291. The opposite electrode 293 may include a transparent conductive layer formed of ITO, $In_2O_3$, or IZO and may also include a semitransparent layer including a metal such as Al or Ag. For example, the opposite electrode 293 may be a semitransparent layer including Mg or Ag.

The low-reflection layer 300 may be disposed on the display element layer 200. For example, the low-reflection layer 300 may be interposed (disposed) between the display element layer 200 and the encapsulation layer 400. The low-reflection layer 300 may include an inorganic material having a low reflectance. The low-reflection layer 300 may include, for example, ytterbium (Yb), bismuth (Bi), cobalt (Co), molybdenum (Mo), titanium (Ti), zirconium (Zr), aluminum (Al), chromium (Cr), niobium (Nb), platinum (Pt), tungsten (W), indium (In), tin (Sn), iron (Fe), nickel (Ni), tantalum (Ta), manganese (Mn), zinc (Zn), germanium (Ge), or any combination thereof. The inorganic material included in the low-reflection layer 300 may have an absorption coefficient of about 0.5 or more.

The low-reflection layer 300 may reduce external light reflection by inducing a destructive interference between the light incident into the display apparatus 1 and the light reflected from the metal disposed under the low-reflection layer 300. Thus, the display quality and visibility of the display apparatus 1 may be improved by reducing the reflectance of external light of the display apparatus 1 through the low-reflection layer 300.

The encapsulation layer 400 may be disposed on the low-reflection layer 300. The encapsulation layer 400 may cover (overlap in a plan view) the display area DA and may extend to the outside of the display area DA. The encapsulation layer 400 may include a first inorganic encapsulation layer 410, an organic encapsulation layer 420, and a second inorganic encapsulation layer 430 as illustrated in FIG. 2.

The first inorganic encapsulation layer 410 may cover (overlap in a plan view) the low-reflection layer 300 and may include silicon oxide, silicon nitride, and/or silicon trioxynitride. Because the first inorganic encapsulation layer 410 is formed along a structure thereunder, the upper surface thereof may not be flat as illustrated in FIG. 2.

The organic encapsulation layer 420 may cover (overlap in a plan view) the first inorganic encapsulation layer 410 and may have a substantially flat upper surface unlike the first inorganic encapsulation layer 410. For example, the upper surface of the organic encapsulation layer 420 may be substantially flat at a portion corresponding to the display area DA. The organic encapsulation layer 420 may include a first organic material. The first organic material may include, for example, at least one of polyethylene terephthalate, polyethylene naphthalate, polycarbonate, polyimide, polyethylene sulfonate, polyoxymethylene, polyarylate, hexamethyldisiloxane, epoxy-based resin, and acryl-based resin (e.g., polymethyl methacrylate or polyacrylic acid).

The second inorganic encapsulation layer 430 may cover (overlap in a plan view) the organic encapsulation layer 420 and may include silicon oxide, silicon nitride, and/or silicon trioxynitride. The second inorganic encapsulation layer 430 may contact the first inorganic encapsulation layer 410 at the edge thereof located outside the display area DA such that the organic encapsulation layer 420 may not be exposed to the outside.

As such, because the encapsulation layer 400 includes the first inorganic encapsulation layer 410, the organic encapsulation layer 420, and the second inorganic encapsulation layer 430, even when a crack occurs in the encapsulation layer 400 through the multilayer structure, the crack may not be connected between the first inorganic encapsulation layer 410 and the organic encapsulation layer 420 or between the organic encapsulation layer 420 and the second inorganic encapsulation layer 430. Accordingly, the formation of a path through which the moisture or oxygen from the outside penetrates into the display area DA may be prevented or minimized. Because the organic light emitting element may be easily damaged by the moisture or oxygen from the outside, the encapsulation layer 400 may cover (overlap in a plan view) and protect the organic light emitting element and/or the low-reflection layer 300.

The input sensing layer 500 may be disposed on the encapsulation layer 400. For example, the input sensing layer 500 may be interposed (disposed) between the encapsulation layer 400 and a light blocking layer 600. The input sensing layer 500 may obtain coordinate information according to an external input, for example, a touch event of an object such as a finger or a stylus pen. The input sensing layer 500 may include a sensing electrode and/or a trace line. The input sensing layer 500 may sense an external input by a mutual capacitive method or a self-capacitive method.

The input sensing layer 500 may include a first conductive layer 521 and a second conductive layer 522 including a sensing electrode and/or a trace line. A first touch insulating layer 510 may be interposed (disposed) between the encapsulation layer 400 and the first conductive layer 521, and a second touch insulating layer 530 may be disposed between the first conductive layer 521 and the second conductive layer 522.

The first conductive layer 521 and the second conductive layer 522 may include a single layer or multiple layers including a conductive material. The conductive material may include molybdenum (Mo), aluminum (Al), copper (Cu), or titanium (Ti). For example, the first conductive layer 521 and the second conductive layer 522 may have a three-layer structure of Ti/Al/Ti.

The first touch insulating layer 510 may include an inorganic insulating material and/or an organic insulating material. The inorganic insulating material may include silicon oxide, silicon nitride, and/or silicon oxynitride, and the organic insulating material may include an acryl-based or imide-based organic material. The second touch insulating layer 530 may include an organic insulating material including an acryl-based or imide-based organic material.

The light blocking layer 600 may be disposed on the input sensing layer 500 and my cover (overlap in a plan view) the second conductive layer 522. Although not illustrated in FIG. 2, an inorganic insulating layer (not illustrated) may be further interposed (disposed) between the light blocking layer 600 and the second conductive layer 522. The inorganic insulating layer may include an inorganic insulating material such as silicon oxide, silicon nitride, or silicon oxynitride. The light blocking layer 600 may include a second opening 600OP corresponding to an emission area EA of the display element 290. The light blocking layer 600 may include second openings 600OP to have a grid shape or a mesh shape. The width of the second opening 600OP of the light blocking layer 600 may be greater than the width of the first opening 280OP of the pixel definition layer 280. The shape of the second opening 600OP of the light blocking layer 600 may be the same as the shape of the first opening 280OP of the pixel definition layer 280.

The light blocking layer 600 may include a light blocking material and may include a black material. The light blocking material may include carbon black, carbon nanotubes, resin or paste including black dye, or metal particles. The metal particles may include, for example, nickel, aluminum, molybdenum, and/or any alloy thereof. The light blocking material may include metal oxide particles such as chromium oxide or metal nitride particles such as chromium nitride. Because the light blocking layer 600 includes the light blocking material, the reflection of external light by metal structures disposed under the light blocking layer 600 may be reduced. However, when necessary, the light blocking layer 600 may include the same material as the pixel definition layer 280 disposed thereunder. However, the disclosure is not limited thereto, and the light blocking layer 600 may include a different material than the pixel definition layer 280.

The first refraction layer 710 may be disposed over the display element 290, for example, over the input sensing layer 500. The first refraction layer 710 may control the path of light emitted from the emission layer of the display element 290 and may function as a condensing lens. Among the light emitted from the emission layer of the display element 290, the first refraction layer 710 may change the path of light propagating in a direction that is not parallel to the axis (z axis) perpendicular to the substrate 100, such that the light may propagate in a direction (+z direction) substantially perpendicular to the substrate 100. The first refraction layer 710 may include a first high-refraction layer 711 and a first low-refraction layer 712.

The first high-refraction layer 711 may be disposed in the second opening 600OP of the light blocking layer 600. For example, the first high-refraction layer 711 may be provided in the form of an island substantially at the center of the second opening 600OP of the light blocking layer 600. The first high-refraction layer 711 may include an acryl-based or siloxane-based organic material. For example, the first high-refraction layer 711 may include polydiarylsiloxane, methyltrimethoxysilane, or tetramethoxysilane. The first high-refraction layer 711 may have a higher refractive index than the first low-refraction layer 712. For example, the refractive index of the first high-refraction layer 711 may be about 1.5 or more, for example, about 1.5 to about 1.8. In an embodiment, the first high-refraction layer 711 may include an acryl-based organic material having a refractive index of about 1.6.

The first low-refraction layer 712 may cover (overlap in a plan view) the light blocking layer 600 and the first high-refraction layer 711. For example, the first low-refraction layer 712 may fill a portion of the second opening 600OP in which the first high-refraction layer 711 is not located, and may be disposed on the light blocking layer 600 and the first high-refraction layer 711. The first low-refraction layer 712 may cover (overlap in a plan view) the entire upper surface of the substrate 100, and the upper surface thereof may be substantially flat.

The first low-refraction layer 712 may include acryl-based resin (e.g., polymethyl methacrylate or polyacrylic acid), ethylhexyl acrylate, pentafluoropropyl acrylate, polyethylene glycol dimethacrylate, or ethylene glycol dimethacrylate. The first low-refraction layer 712 may further include a photo curing agent and/or a thermal curing agent such as epoxy. The first low-refraction layer 712 may have a lower refractive index than the first high-refraction layer 711. For example, the refractive index of the first low-refraction layer 712 may be about 1.2 or more. In an embodiment, the refractive index may be about 1.2 to about 1.5.

Figure 3:
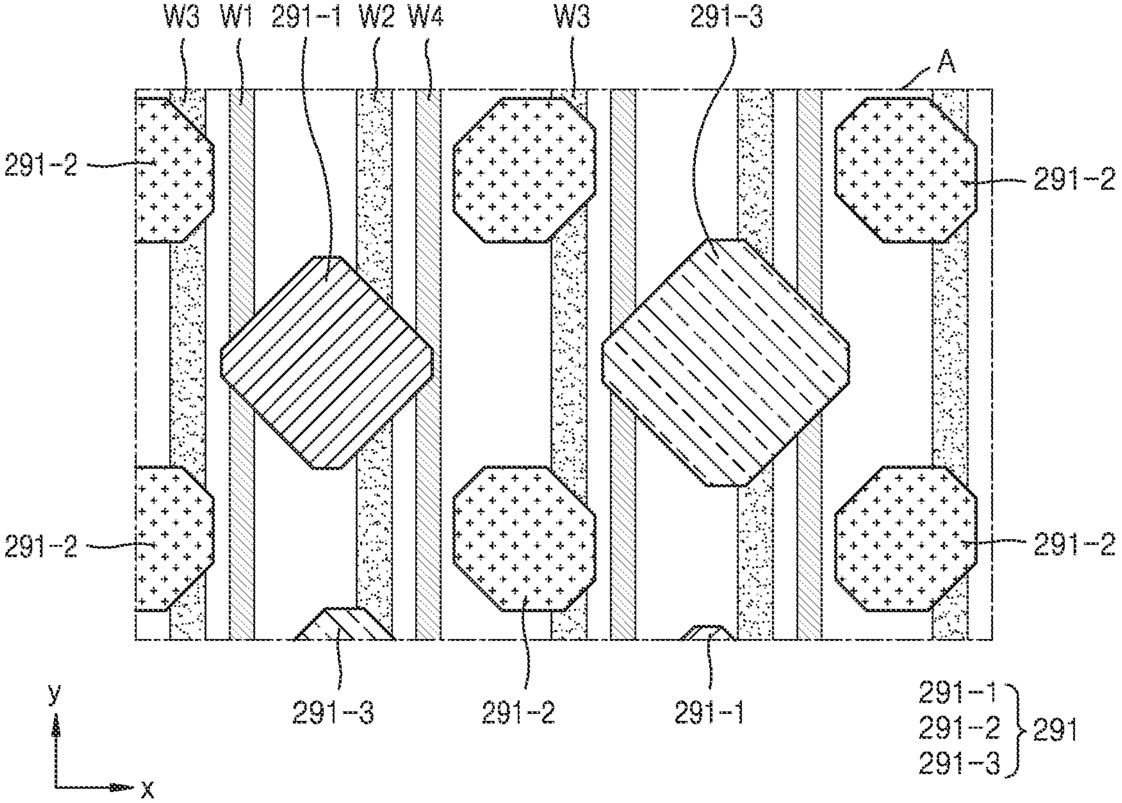
FIG. 3 is a schematic plan view illustrating a portion of a display apparatus according to an embodiment.

In FIG. 2, for convenience of illustration, the upper surfaces of the pixel electrodes 291 are illustrated as being flat; however, because lines may be located under the pixel electrodes 291 as illustrated in FIG. 3 (a schematic plan view illustrating a portion of region A of FIG. 1), the upper surfaces of the pixel electrodes 291 may be inclined differently from each other.

For example, as illustrated in FIG. 3, lines may be located under the pixel electrodes 291. The pixel electrode 291 may include a first pixel electrode 291-1, a second pixel electrode 291-2, and a third pixel electrode 291-3. For convenience of illustration, the first to third pixel electrodes 291-1, 291-2, and 291-3 and first to fourth lines W1, W2, W3, and W4 are illustrated in FIG. 3; however, the planarization layer 270 may be interposed (disposed) between the first to third pixel electrodes 291-1, 291-2, and 291-3 and the first to fourth lines W1, W2, W3, and W4.

One side (in the +x direction) of the first pixel electrode 291-1 and the third pixel electrode 291-3 may be located substantially over the fourth line W4, and the other side (in the −x direction) of the first pixel electrode 291-1 and the third pixel electrode 291-3 may be located substantially over the first line W1. The center portion of the first pixel electrode 291-1 and the third pixel electrode 291-3 may be located substantially over the second line W2. Thus, the first pixel electrode 291-1 and the third pixel electrode 291-3 may have a generally flat shape without being inclined to one side with respect to the substrate 100. However, one side (in the +x direction) of the second pixel electrode 291-2 may be located substantially over the third line W3, and lines may not be located under the other side (in the −x direction) of the second pixel electrode 291-2. Thus, the second pixel electrode 291-2 may be relatively inclined with respect to the substrate 100. This may be because a portion located over the third line W3, which is one side (in the +x direction) of the second pixel electrode 291-2, is more distant from the substrate 100 than the other side (in the −x direction) of the second pixel electrode 291-2 located over the space between the fourth line W4 and the third line W3.

As described above, a portion of the light generated from the emission layer of the display element 290 may be reflected from the pixel electrode 291 and propagate to the outside, and the angle at which the light propagates to the outside may vary depending on the inclination of the pixel electrode 291. The angle at which the light reflected from the pixel electrode 291 propagates to the outside may vary depending on the inclination of the pixel electrode 291. For example, because the inclination of the first pixel electrode 291-1 and the third pixel electrode 291-3 is different from the inclination of the second pixel electrode 291-2, the light generated from the emission layer of the display element 290 including the second pixel electrode 291-2 may be extracted to the outside at a different angle than the light generated from the emission layer of the display element 290 including the first pixel electrode 291-1 or the third pixel electrode 291-3. Accordingly, when the emission layer of the display element 290 including the second pixel electrode 291-2 generates green light, the user may visually recognize a reflection color band because the user perceives the green light as relatively stronger at some viewing angles, but relatively weaker at other viewing angles.

The display apparatus 1 according to the embodiment may include scattering particles 900 disposed over the display element 290. For example, the scattering particles 900 may be dispersed and disposed in the first high-refraction layer 711. Because the light generated from the emission layer, reflected from the pixel electrode 291, and propagating to the outside is scattered by the scattering particles 900, the user may not visually recognize a color band due to the reflection from the pixel electrode 291. In other examples, the perception of the color band (although visible) may be minimized.

Figure 4:
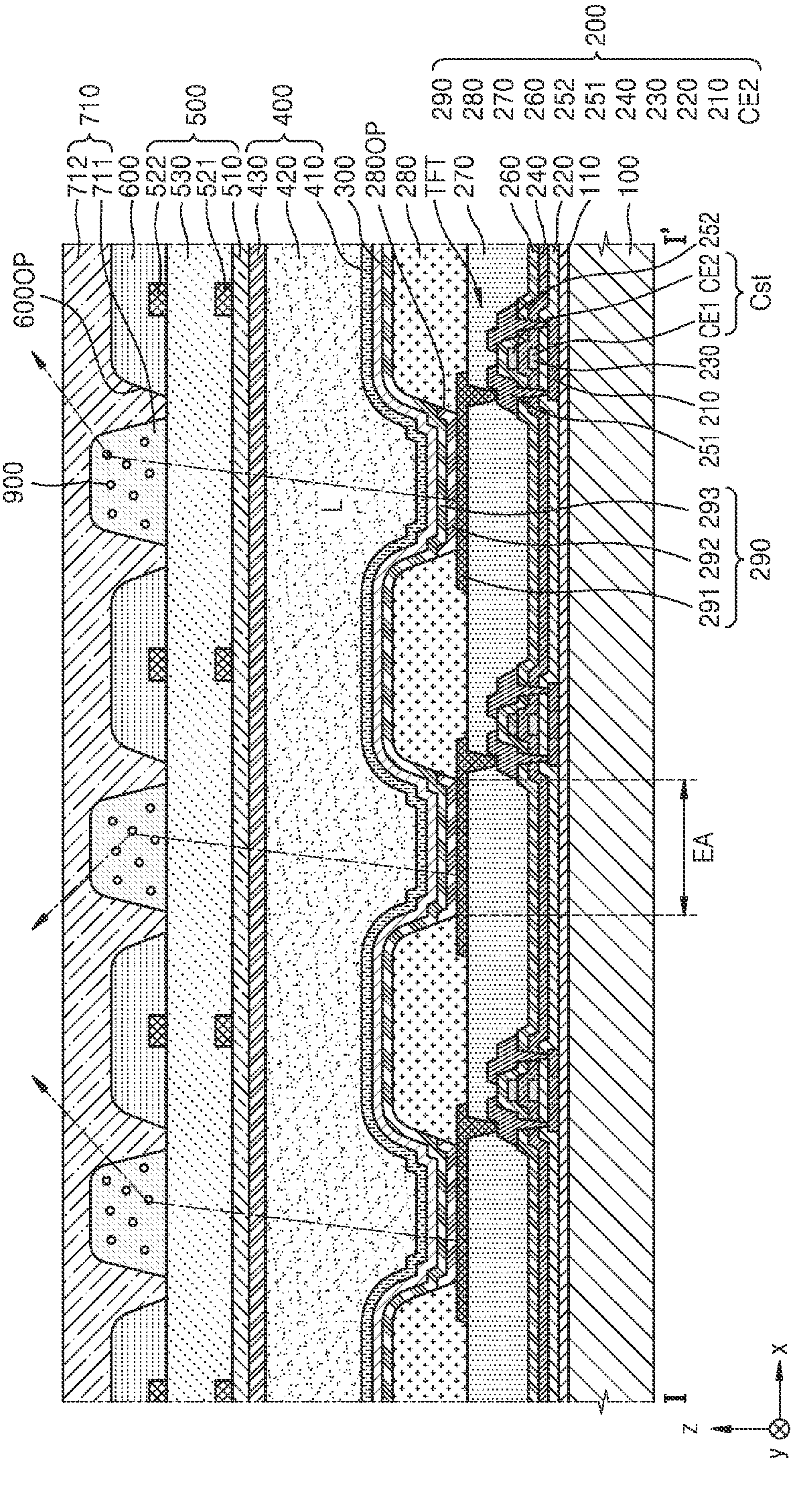
FIG. 4 is a diagram for describing an optical path of light reflected from a pixel electrode of a display apparatus according to an embodiment.

As illustrated in FIG. 4, which illustrates the optical path of light reflected from an electrode of the display element 290 of the display apparatus 1 according to an embodiment, the pixel electrode 291 may reflect light L generated from the emission layer of the display element 290. Because the inclination of each pixel electrodes 291 may vary, the angle at which the light L propagates to the outside may vary depending on the pixel electrode 291. As the light L propagates to the outside, the light L may reach the first high-refraction layer 711 and may be scattered by the scattering particles 900. Accordingly, the user may not visually recognize any color band due to reflection from the pixel electrode 291, or the visual perception of a color band may be minimized.

The scattering particles 900 may include titanium oxide ($TiO_2$), zinc oxide (ZnO), zirconium oxide ($ZrO_2$), aluminum oxide ($Al_2O_3$), silicon oxide ($SiO_2$), or polymer beads. The scattering particles 900 may be spherically or amorphously dispersed in the first high-refraction layer 711. When the scattering particles 900 are spherically dispersed in the first high-refraction layer 711, the average diameter of the scattering particles 900 may be about 0.8 μm to about 3.0 μm.

The light incident on fine particles such as the scattering particles 900 may be scattered. For example, the light incident on the scattering particles 900 may be forward scattered in a propagation direction thereof or may be backward scattered in a direction opposite to the propagation direction. When the diameter of the scattering particles 900 is less than the wavelength of the incident light, Rayleigh scattering may occur in which forward scattering and backward scattering occur at similar levels. However, when the diameter of the scattering particles 900 is similar to or greater than the wavelength of the incident light, Mie scattering may occur in which forward scattering occurs overwhelmingly more than backward scattering.

When the average diameter of the scattering particles 900 is less than about 0.8 μm, Rayleigh scattering may occur with respect to light in the visible light region. Accordingly, because the light generated from the intermediate layer 292 is Rayleigh-scattered, as backward scattering occurs at a similar level to forward scattering, the light extraction efficiency thereof may decrease. When the average diameter of the scattering particles 900 is greater than about 3.0 μm, the layer quality thereof may be degraded due to the relatively large size of the particles when the first high-refraction layer 711 is formed. When the average diameter of the scattering particles 900 is greater than about 3.0 μm, it may be difficult to discharge the resin provided to form the first high-refraction layer 711 from a nozzle in the manufacturing process thereof. Discharge ports of the nozzle used to form the first high-refraction layer 711 may be blocked due to the large diameter of the scattering particles 900. Furthermore, when the average diameter of the scattering particles 900 becomes too large, the first high-refraction layer 711 may be thickened and thus the opacity thereof may increase.

The scattering particles 900 of the display apparatus 1 according to the embodiment may have an average diameter of about 0.8 μm to about 3.0 μm. Accordingly, because the light incident on the scattering particles 900 is Mie-scattered, the light extraction efficiency may not decrease as forward scattering increases overwhelmingly. Thus, because the display apparatus 1 according to the embodiment may maintain the light extraction efficiency and simultaneously scatter the light generated from the emission layer, reflected from the pixel electrode 291, and propagating to the outside, the degradation of the display quality of the display apparatus 1 may be prevented or minimized.

Although it has been described above that the scattering particles 900 are disposed in the first high-refraction layer 711, the disclosure is not limited thereto. For example, as illustrated in FIG. 5, a schematic cross-sectional view illustrating a portion of the display apparatus 1 according to an embodiment, the scattering particles 900 may be disposed in a reflection adjusting layer 720.

Figure 5:
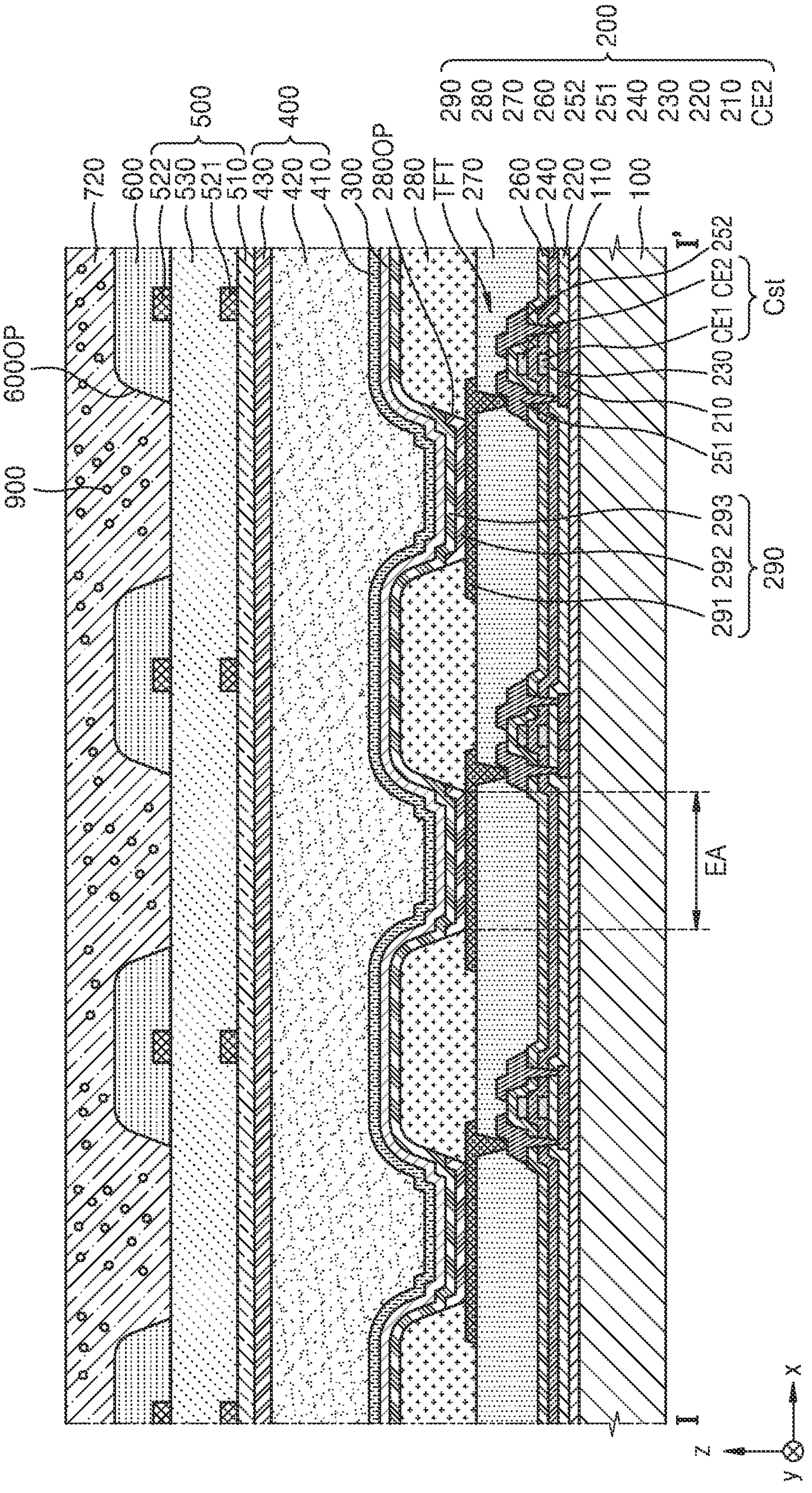
FIG. 5 is a schematic cross-sectional view illustrating a portion of a display apparatus according to an embodiment.

As illustrated in FIG. 5, the display apparatus 1 may include a substrate 100, a display element layer 200, a low-reflection layer 300, an encapsulation layer 400, an input sensing layer 500, a light blocking layer 600, and a reflection adjusting layer 720 and may not include a first refraction layer 710. The above description of the substrate 100, the display element layer 200, the low-reflection layer 300, the encapsulation layer 400, the input sensing layer 500, and the light blocking layer 600 may also be applied to the substrate 100, the display element layer 200, the low-reflection layer 300, the encapsulation layer 400, the input sensing layer 500, and the light blocking layer 600 of the display apparatus 1 according to the embodiment, and thus, redundant descriptions thereof will be omitted.

The reflection adjusting layer 720 may be disposed to cover (overlap in a plan view) the light blocking layer 600 and may fill the second opening 600OP of the light blocking layer 600. The reflection adjusting layer 720 may control the reflection of external light by selectively absorbing light of some wavelength bands among the light introduced into the display apparatus 1 from the outside. The reflection adjusting layer 720 may improve the visibility by reducing the reflection of external light by absorbing light of wavelength bands other than the wavelength bands of light generated from the emission layer of the display element 290 among the light incident from outside the display apparatus 1 or reflected inside the display apparatus 1.

For this purpose, the reflection adjusting layer 720 may include an organic material layer including dye, pigment, or a combination thereof. For example, the reflection adjusting layer 720 may include an oxazine-based compound, a cyanine-based compound, a tetraazoporfin-based compound, or a squarylium-based compound. The reflection adjusting layer 720 may include a compound represented by any one of Formulas 1 to 4 below.

<Formula 1>

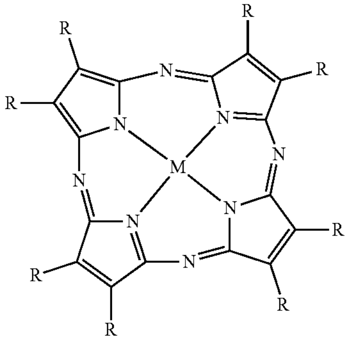

<Formula 2>

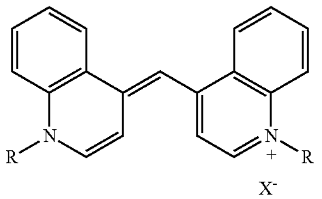

-continued

<Formula 3>

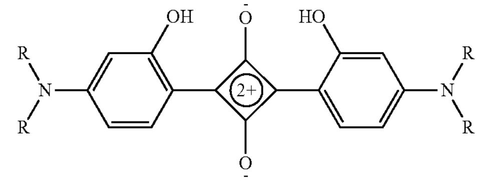

<Formula 4>

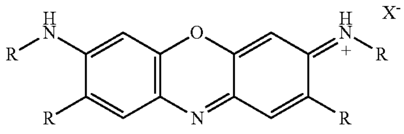

In Formulas 1 to 4,

M may be a metal.

$X^-$ may be a monovalent anion.

R may equal to or different from each other and may be respectively hydrogen, deuterium (-D), —F, —CI, —Br, —I, hydroxyl group, cyano group, or nitro group;

deuterium, —F, —CI, —Br, —I, hydroxyl group, cyano group, nitro group, $C_3$-$C_{60}$ carbocyclic group, $C_1$-$C_{60}$ heterocyclic group, $C_6$-$C_{60}$ aryloxy group, $C_6$-$C_{60}$ arylthio group, —Si($Q_{11}$)($Q_{12}$)($Q_{13}$), —N($Q_{11}$)($Q_{12}$), —B($Q_{11}$)($Q_{12}$), —C(=O)($Q_{11}$), —S(=O)$_2$($Q_{11}$), —P(=O)($Q_{11}$)($Q_{12}$), or $C_1$-$C_{60}$ alkyl group, $C_2$-$C_{60}$ alkenyl group, $C_2$-$C_{60}$ alkynyl group, or alkoxy group substituted or unsubstituted with any combination thereof;

deuterium, —F, —CI, —Br, —I, hydroxyl group, cyano group, nitro group, $C_1$-$C_{60}$ alkyl group, $C_2$-$C_{60}$ alkenyl group, $C_2$-$C_{60}$ alkynyl group, $C_1$-$C_{60}$ alkoxy group, $C_3$-$C_{60}$ carbocyclic group, $C_1$-$C_{60}$ heterocyclic group, $C_6$-$C_{60}$ aryloxy group, $C_6$-$C_{60}$ arylthio group, —Si($Q_{21}$)($Q_{22}$)($Q_{23}$), —N($Q_{21}$)($Q_{22}$), —B($Q_{21}$)($Q_{22}$), —C(=O)($Q_{21}$), —S(=O)$_2$($Q_{21}$), —P(=O)($Q_{21}$)($Q_{22}$), or $C_3$-$C_{60}$ carbocyclic group, $C_1$-$C_{60}$ heterocyclic group, $C_6$-$C_{60}$ aryloxy group, or $C_6$-$C_{60}$ arylthio group substituted or unsubstituted with any combination thereof; or —Si($Q_{31}$)($Q_{32}$)($Q_{33}$), —N($Q_{31}$)($Q_{32}$), —B($Q_{31}$)($Q_{32}$), —C(=O)($Q_{31}$), —S(=O)$_2$($Q_{31}$), or —P(=O)($Q_{31}$)($Q_{32}$).

$Q_1$ to $Q_3$, $Q_{11}$ to $Q_{13}$, $Q_{21}$ to $Q_{23}$, and $Q_{31}$ to $Q_{33}$ may be independently hydrogen; deuterium; —F; —CI; —Br; —I; hydroxyl group; cyano group; nitro group; $C_1$-$C_{60}$ alkyl group; $C_2$-$C_{60}$ alkenyl group; $C_2$-$C_{60}$ alkynyl group; $C_1$-$C_{60}$ alkoxy group; or deuterium, —F, cyano group, $C_1$-$C_{60}$ alkyl group, $C_1$-$C_{60}$ alkoxy group, phenyl group, biphenyl group, or $C_3$-$C_{60}$ carbocyclic group or $C_1$-$C_{60}$ heterocyclic group substituted or unsubstituted with any combination thereof.

$X^-$ may be halide ion, carboxylate ion, nitrate ion, sulfonate ion, or bisulfate ion. For example, $X^-$ may be $F^-$, $Cl^-$, $Br^-$, $I^-$, $CH_3COO^-$, $NO_3$, $HSO_4$, propionate ion, benzene sulfonate ion, or the like.

As illustrated in FIG. 5, scattering particles 900 may be dispersed and disposed in the reflection adjusting layer 720. Because the scattering particles 900 are disposed over the display element 290, the scattering particles 900 may prevent or minimize the degradation of the display quality of the display apparatus 1 by scattering the light generated from the emission layer, reflected from the pixel electrode 291, and propagating to the outside. For example, the light generated from the emission layer of the intermediate layer 292 may propagate to the outside at different angles according to the inclination of each pixel electrode 291. The light propagating to the outside may be scattered by the scattering particles 900 after reaching the reflection adjusting layer 720 disposed over the pixel electrode 291. Accordingly, because the light generated from the emission layer, reflected from the pixel electrode 291, and propagating to the outside is scattered, the user may not visually recognize any color band due to reflection from the pixel electrode 291 or the perception of a color band may be minimized.

Figure 6:
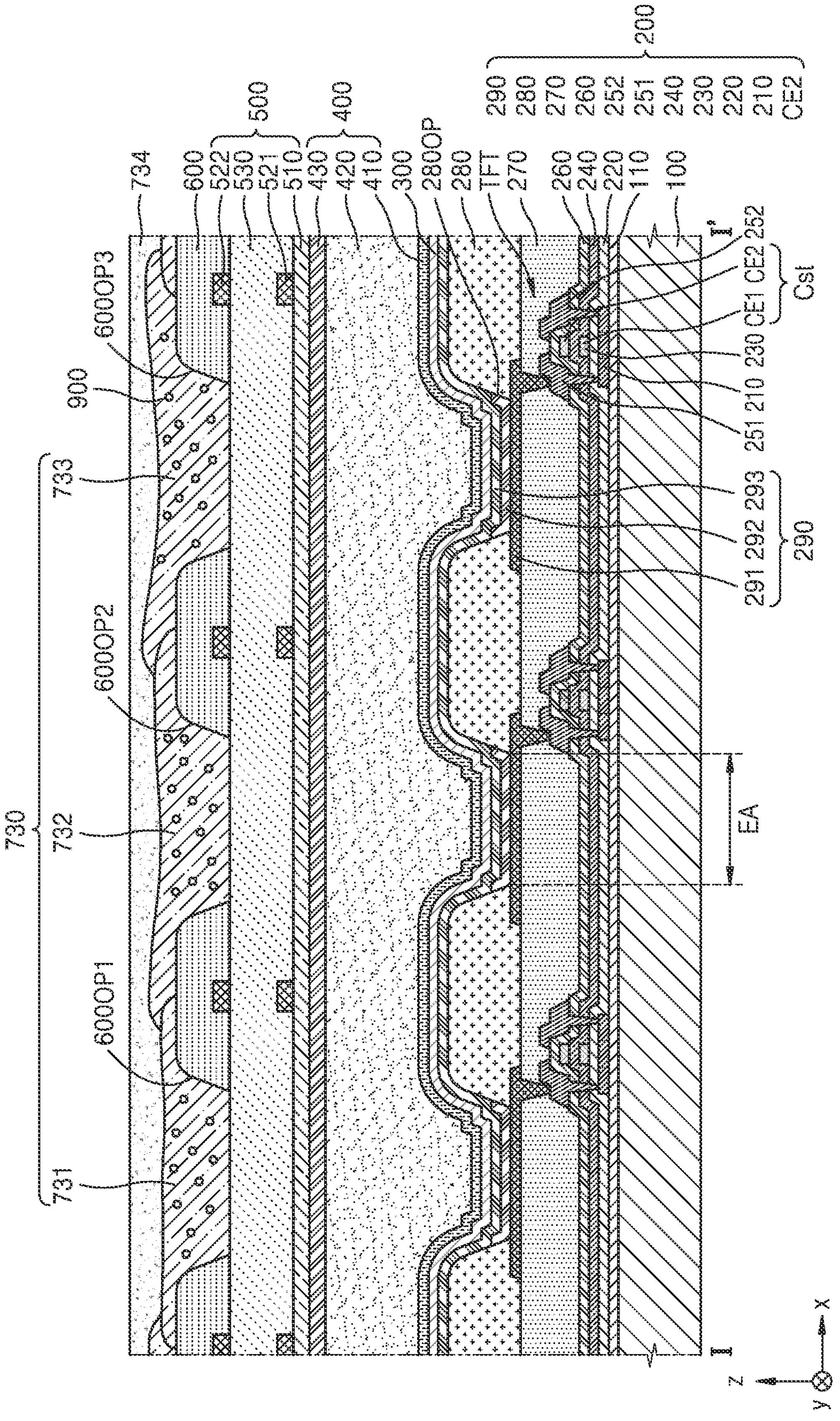
FIG. 6 is a schematic cross-sectional view illustrating a portion of a display apparatus according to an embodiment.

As illustrated in FIG. 6 that is a cross-sectional view schematically illustrating a portion of the display apparatus 1 according to an embodiment, the scattering particles 900 may be disposed in a color filter layer 730. As illustrated in FIG. 6, the display apparatus 1 may include a substrate 100, a display element layer 200, a low-reflection layer 300, an encapsulation layer 400, an input sensing layer 500, a light blocking layer 600, a color filter layer 730, and a color filter planarization layer 734 and may not include a first refraction layer 710 and a reflection adjusting layer 720. The above description of the substrate 100, the display element layer 200, the low-reflection layer 300, the encapsulation layer 400, the input sensing layer 500, and the light blocking layer 600 may also be applied to the substrate 100, the display element layer 200, the low-reflection layer 300, the encapsulation layer 400, the input sensing layer 500, and the light blocking layer 600 of the display apparatus 1 according to the embodiment, and thus, redundant descriptions thereof will be omitted for conciseness.

The color filter layer 730 may be disposed to cover (overlap in a plan view) the light blocking layer 600 and may fill the second opening 600OP of the light blocking layer 600. The color filter layer 730 may include a first color filter 731, a second color filter 732, and a third color filter 733, and the second opening 600OP may include a (2-1)th opening 600OP1, a (2-2)th opening 600OP2, and a (2-3)th opening 600OP3. The first color filter 731, the second color filter 732, and the third color 733 may respectively fill the (2-1)th opening 600OP1, the (2-2)th opening 600OP2, and the (2-3)th opening 600OP3.

In a display apparatus, in order to reduce the reflection of external light, a color filter may be disposed over each pixel. For example, a red color filter passing only red light may be disposed over a pixel emitting red light, a blue color filter passing only blue light may be disposed over a pixel emitting blue light, and a green color filter passing only green light may be disposed over a pixel emitting green light. Accordingly, when external light that is white light is incident, for example, on the red color filter, the blue light and the green light may be absorbed by the red color filter and only the red light may pass through the red color filter and may be reflected from a pixel electrode and emitted to the outside after pass through the red color filter again. Thus, in a display apparatus including a color filter, the reflection of external light may decrease to about ⅓ compared to a display apparatus without a color filter.

Each of the first to third color filters 731, 732, and 733 may have a color corresponding to the light emitted from the emission layer of the display element 290 disposed under each color filter. For example, when red light is emitted from the emission layer of the display element 290 disposed under the first color filter 731, the first color filter 731 may be a red color filter; when green light is emitted from the emission layer of the display element 290 disposed under the second color filter 732, the second color filter 732 may be a green color filter; and when blue light is emitted from the emission layer of the display element 290 disposed under the third color filter 733, the third color filter 733 may be a blue color filter.

The color filter planarization layer 734 may be disposed to cover (overlap in a plan view) the color filter layer 730. The color filter planarization layer 734 may be a colorless transparent layer not having a color of the visible light band and may planarize the upper surface of the color filter layer 730. The color filter planarization layer 734 may include a colorless transparent organic material such as an acryl-based resin. For example, the color filter planarization layer 734 may include an organic material such as acryl, benzocyclobutene (BCB), or hexamethyldisiloxane (HMDSO).

As illustrated in FIG. 6, scattering particles 900 may be dispersed and disposed in the color filter layer 730. Because the scattering particles 900 are disposed over the display element 290, the scattering particles 900 may prevent or minimize the degradation of the display quality of the display apparatus 1 by scattering the light generated from the emission layer, reflected from the pixel electrode 291, and propagating to the outside. The light generated from the emission layer of the intermediate layer 292 may propagate to the outside at different angles according to the inclination degree of each pixel electrode 291. The light propagating to the outside may be scattered by the scattering particles 900 after reaching the color filter layer 730 disposed over the pixel electrode 291. Accordingly, because the light generated from the emission layer, reflected from the pixel electrode 291, and propagating to the outside is scattered, the user may not visually recognize any color band due to reflection from the pixel electrode 291 or the perception of a color band may be minimized. Scattering particles 900 may be dispersed and disposed in only any one of the first to third color filters 731, 732, and 733.

Figure 7:
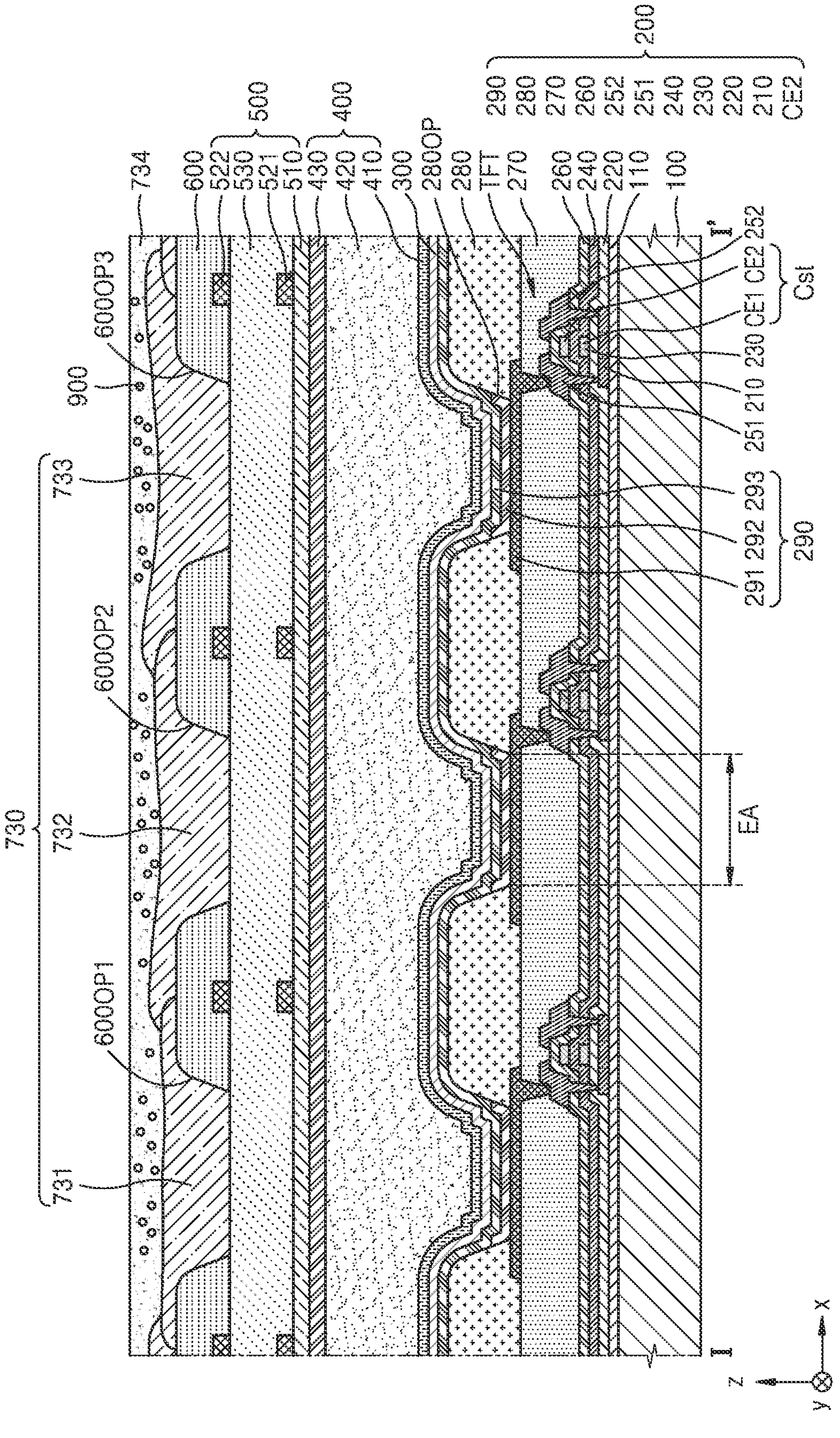
FIG. 7 is a schematic cross-sectional view illustrating a portion of a display apparatus according to an embodiment.

Although FIG. 6 illustrates that the scattering particles 900 are dispersed and disposed in the color filter layer 730, the disclosure is not limited thereto. For example, as illustrated in FIG. 7, a schematic cross-sectional view schematically illustrating a portion of the display apparatus 1 according to an embodiment, the scattering particles 900 may be dispersed and disposed in the color filter planarization layer 734. Because the scattering particles 900 are disposed over the display element 290, the same effect as where the scattering particles 900 are dispersed and disposed in the color filter layer 730 may be achieved.

Figure 8:
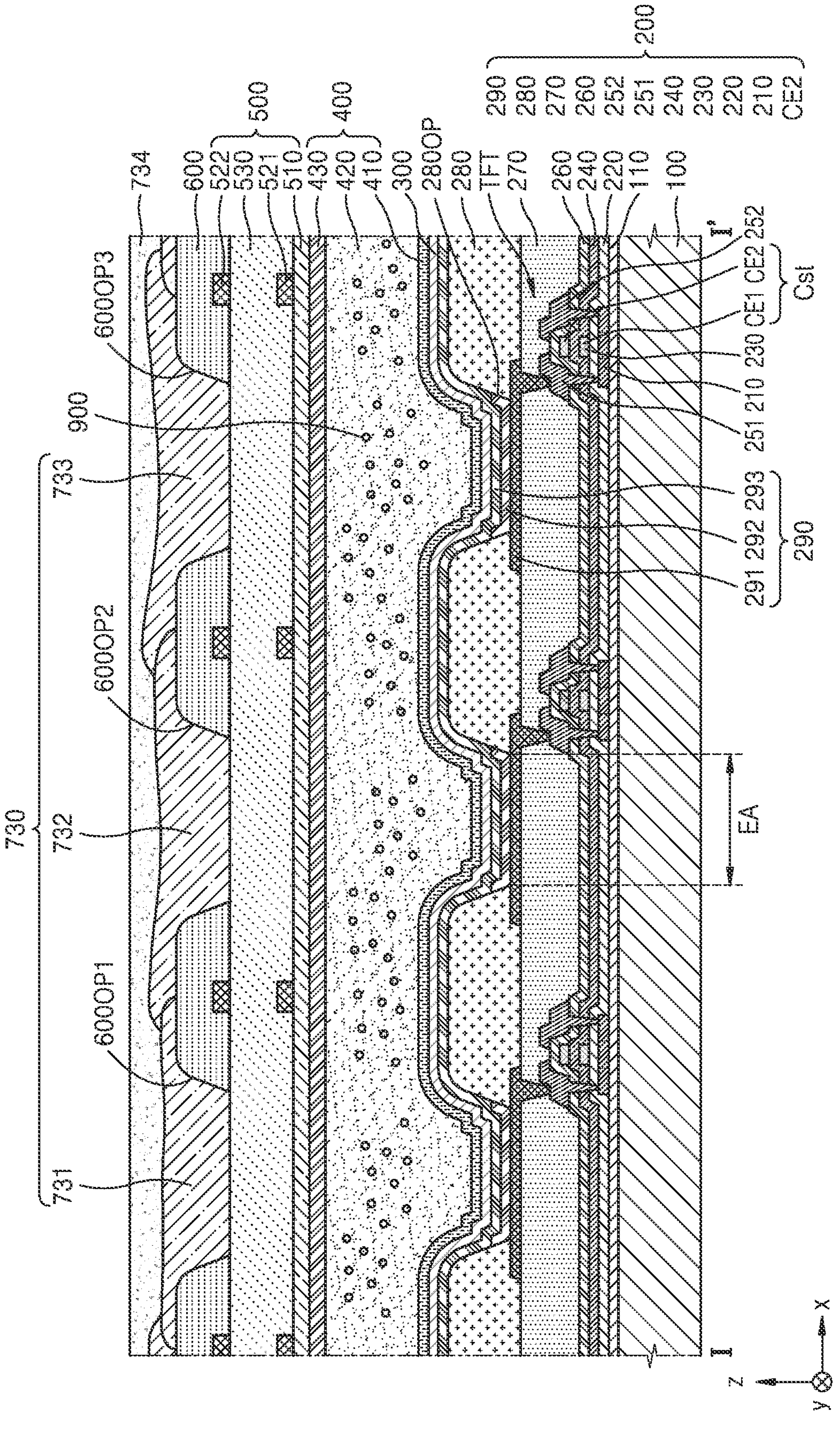
FIG. 8 is a schematic cross-sectional view illustrating a portion of a display apparatus according to an embodiment.

As illustrated in FIG. 8, a schematic cross-sectional view schematically illustrating a portion of the display apparatus 1 according to an embodiment, the scattering particles 900 may be dispersed and disposed in the organic encapsulation layer 420 of the encapsulation layer 400. Because the scattering particles 900 are disposed over the display element 290, the scattering particles 900 may prevent or minimize the degradation of the display quality of the display apparatus 1 by scattering the light generated from the emission layer, reflected from the pixel electrode 291, and propagating to the outside. The light generated from the emission layer of the intermediate layer 292 may propagate to the outside at different angles according to the inclination degree of each pixel electrode 291. The light propagating to the outside may be scattered by the scattering particles 900 after reaching the organic encapsulation layer 420 disposed over the pixel electrode 291. Accordingly, because the light generated from the emission layer, reflected from the pixel electrode 291, and propagating to the outside is scattered, the user may not visually recognize any color band due to reflection from the pixel electrode 291 or the perception of a color band may be minimized.

Although FIG. 8 illustrates that the scattering particles 900 are dispersed and disposed in the organic encapsulation layer 420 of the display apparatus 1 including the color filter layer 730 and the color filter planarization layer 734 without including the first refraction layer 710 and the reflection adjusting layer 720, the disclosure is not limited thereto. For example, even when the display apparatus 1 includes the first refraction layer 710 or the reflection adjusting layer 720 and does not include the color filter layer 730 and the color filter planarization layer 734, the scattering particles 900 may be dispersed and disposed in the organic encapsulation layer 420 of the display apparatus 1.

Figure 9:
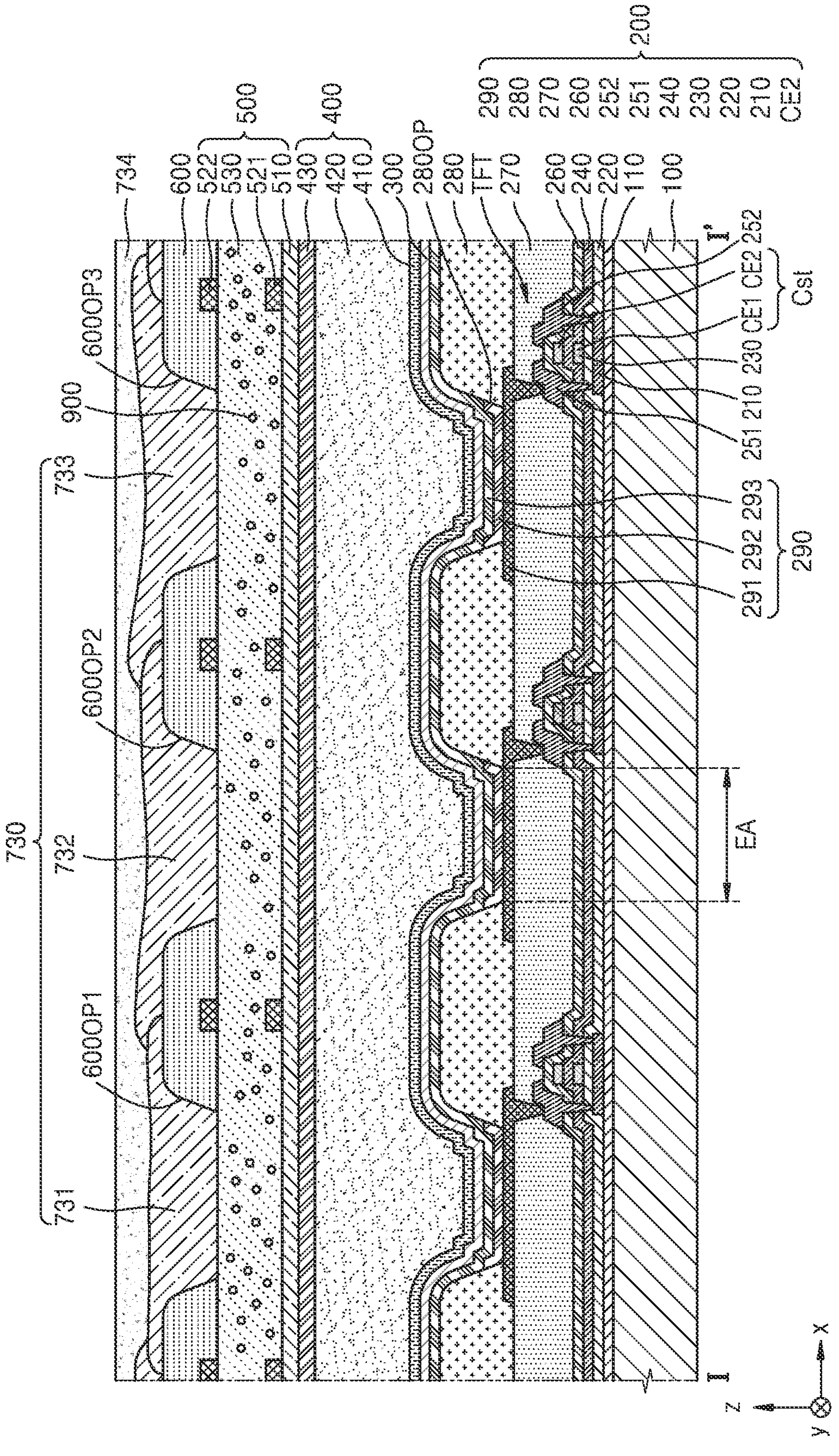
FIG. 9 is a schematic cross-sectional view illustrating a portion of a display apparatus according to an embodiment.

As illustrated in FIG. 9, a schematic cross-sectional view illustrating a portion of the display apparatus 1 according to an embodiment, the scattering particles 900 may be dispersed and disposed in the input sensing layer 500. The scattering particles 900 may be dispersed and disposed in the second touch insulating layer 530 of the input sensing layer 500. Because the scattering particles 900 are located over the display element 290, the scattering particles 900 may prevent or minimize the degradation of the display quality of the display apparatus 1 by scattering the light generated from the emission layer, reflected from the pixel electrode 291, and propagating to the outside. For example, the light generated from the emission layer of the intermediate layer 292 may propagate to the outside at different angles according to the inclination degree of each pixel electrode 291. The light propagating to the outside may be scattered by the scattering particles 900 after reaching the second touch insulating layer 530 disposed over the pixel electrode 291. Accordingly, because the light generated from the emission layer, reflected from the pixel electrode 291, and propagating to the outside is scattered, the user may not visually recognize any color band due to reflection from the pixel electrode 291 or the perception of a color band may be minimized.

Although FIG. 9 illustrates that the scattering particles 900 are dispersed and disposed in the second touch insulating layer 530 of the display apparatus 1 including the color filter layer 730 and the color filter planarization layer 734 without including the first refraction layer 710 and the reflection adjusting layer 720, the disclosure is not limited thereto. For example, even when the display apparatus 1 includes the first refraction layer 710 or the reflection adjusting layer 720 and does not include the color filter layer 730 and the color filter planarization layer 734, the scattering particles 900 may be dispersed and disposed in the second touch insulating layer 530 of the display apparatus 1.

Figure 10:
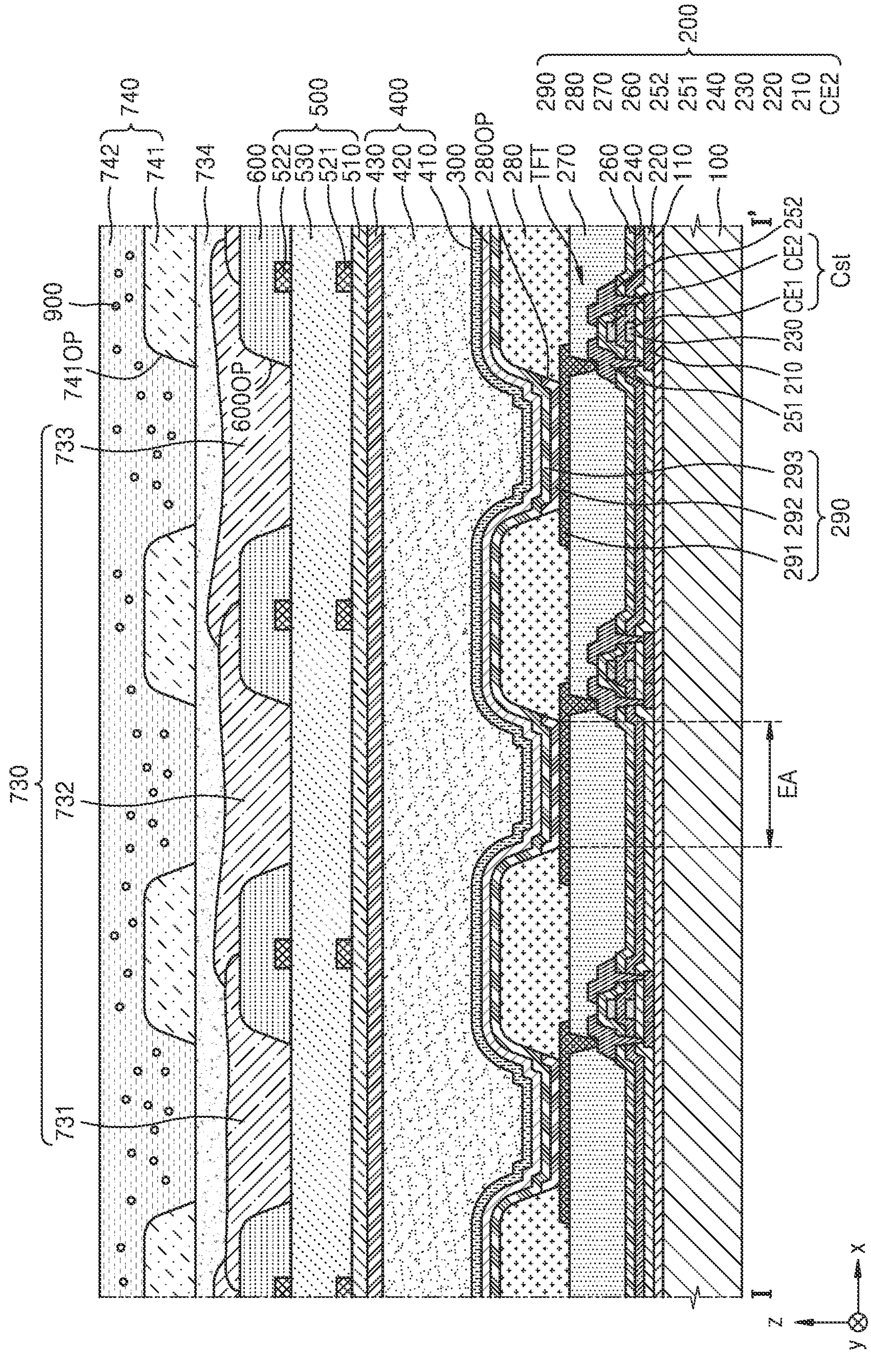
FIG. 10 is a schematic cross-sectional view illustrating a portion of a display apparatus according to an embodiment.

Although FIGS. 6 to 9 illustrate that the display apparatus 1 includes the substrate 100, the display element layer 200, the low-reflection layer 300, the encapsulation layer 400, the input sensing layer 500, the light blocking layer 600, the color filter layer 730, and the color filter planarization layer 734, the disclosure is not limited thereto. For example, as illustrated in FIG. 10 that is a cross-sectional view schematically illustrating a portion of the display apparatus 1 according to an embodiment, the display apparatus 1 may further include a second refraction layer 740.

The second refraction layer 740 may be disposed on the color filter planarization layer 734 and may include a second low-refraction layer 741 and a second high-refraction layer 742. For example, the second low-refraction layer 741 may be disposed on the color filter planarization layer 734. The second low-refraction layer 741 may include a third opening 741OP corresponding to the second opening 600OP of the light blocking layer 600. Accordingly, the third opening 741OP of the second low-refraction layer 741 may correspond to the emission area EA of the display element 290. The second low-refraction layer 741 may have a grid shape or a mesh shape by including third openings 741OP. The width of the third opening 741OP of the second low-refraction layer 741 may be greater than the width of the second opening 600OP of the light blocking layer 600. The shape of the third opening 741OP of the second low-refraction layer 741 may be the same as the shape of the first opening 280OP of the pixel definition layer 280 and the shape of the second opening 600OP of the light blocking layer 600.

The second low-refraction layer 741 may include a transparent inorganic material or an organic material having a low refractive index. For example, the inorganic material may include silicon oxide, silicon oxynitride, magnesium fluoride, or the like. The organic material may include at least one of acryl, polyimide, polyamide, and Alq3[Tris(8-hydroxyquinolinato)aluminum]. The refractive index of the second low-refraction layer 741 may be about 1.2 or more. For example, the refractive index of the second low-refraction layer 741 may be about 1.2 to about 1.5. However, the disclosure is not limited thereto.

The second high-refraction layer 742 may be disposed on the second low-refraction layer 741 while filling the third opening 741OP of the second low-refraction layer 741. For example, the second high-refraction layer 742 may cover (overlap in a plan view) the second low-refraction layer 741. The second high-refraction layer 742 may cover (overlap in a plan view) the entire upper surface of the substrate 100, and the upper surface thereof may be substantially flat.

The second high-refraction layer 742 may include an organic material. The organic material may include at least one of polyethylene terephthalate, polyethylene naphthalate, polycarbonate, polyimide, polyethylene sulfonate, polyoxymethylene, polyarylate, hexamethyldisiloxane, epoxy-based resin, and acryl-based resin (e.g., polymethyl methacrylate or polyacrylic acid). The second high-refraction layer 742 may include high-refraction particles (not illustrated) dispersed in an organic material. The high-refraction particles may include metal oxide such as zirconium oxide, zinc oxide, titanium oxide, niobium oxide, tantalum oxide, tin oxide, nickel oxide, silicon nitride, indium nitride, gallium nitride, or the like. The scattering particles 900 may be spherically or amorphously dispersed in the second high-refraction layer 742. When the high-refraction particles are spherically dispersed in the second high-refraction layer 742, the average diameter of the high-refraction particles may be about 20 nm to about 30 nm.

Because the second high-refraction layer 742 includes high-refraction particles, the second high-refraction layer 742 may have a higher refractive index than the second low-refraction layer 741. The refractive index of the second high-refraction layer 742 may be about 1.5 or more. For example, the refractive index of the second high-refraction layer 742 may be about 1.5 to about 1.8; however, the disclosure is not limited thereto.

As illustrated in FIG. 10, the scattering particles 900 may be dispersed and disposed in the second refraction layer 740. For example, the scattering particles 900 may be dispersed and disposed in the second high-refraction layer 742 of the second refraction layer 740. Because the scattering particles 900 are disposed over the display element 290, the scattering particles 900 may prevent or minimize the degradation of the display quality of the display apparatus 1 by scattering the light generated from the emission layer, reflected from the pixel electrode 291, and propagating to the outside. The light generated from the emission layer of the intermediate layer 292 may propagate to the outside at different angles according to the inclination degree of each pixel electrode 291. The light propagating to the outside may be scattered by the scattering particles 900 after reaching the second high-refraction layer 742 disposed over the pixel electrode 291. Accordingly, because the light generated from the emission layer, reflected from the pixel electrode 291, and propagating to the outside is scattered, the user may not visually recognize a color band due to reflection from the pixel electrode 291 or the degree of a color band may be minimized although visually recognized.

Although FIG. 10 illustrates that the display apparatus 1 including the color filter layer 730 and the color filter planarization layer 734 without including the first refraction layer 710 and the reflection adjusting layer 720 further includes the second refraction layer 740 and the scattering particles 900 are dispersed and disposed in the second refraction layer 740, the disclosure is not limited thereto. For example, even when the display apparatus 1 includes the reflection adjusting layer 720 and does not include the color filter layer 730 and the color filter planarization layer 734, the display apparatus 1 may further include the second refraction layer 740 and the scattering particles 900 may be dispersed and disposed in the second refraction layer 740.

Figure 11:
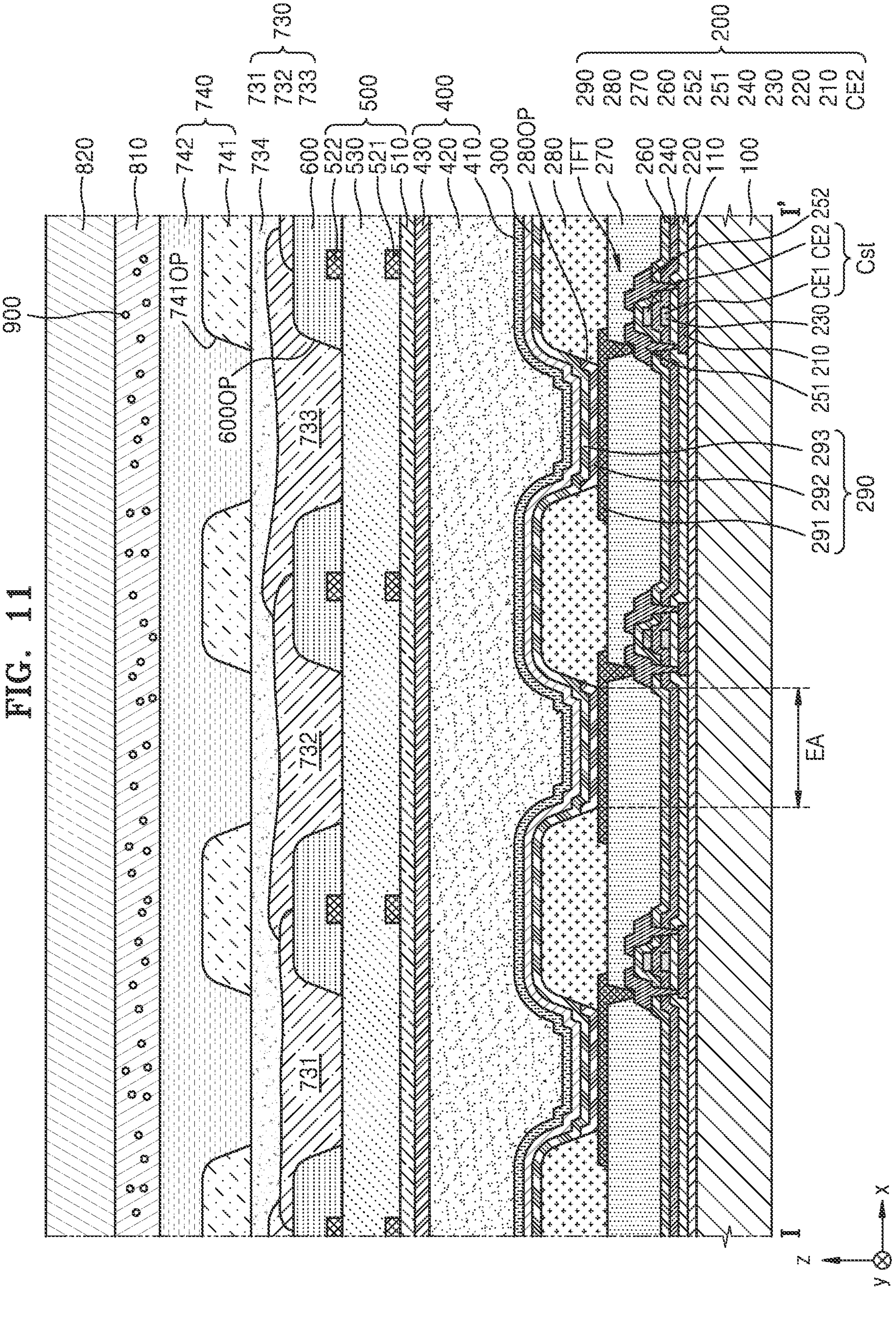
FIG. 11 is a schematic cross-sectional view illustrating a portion of a display apparatus according to an embodiment.
Figure 12:
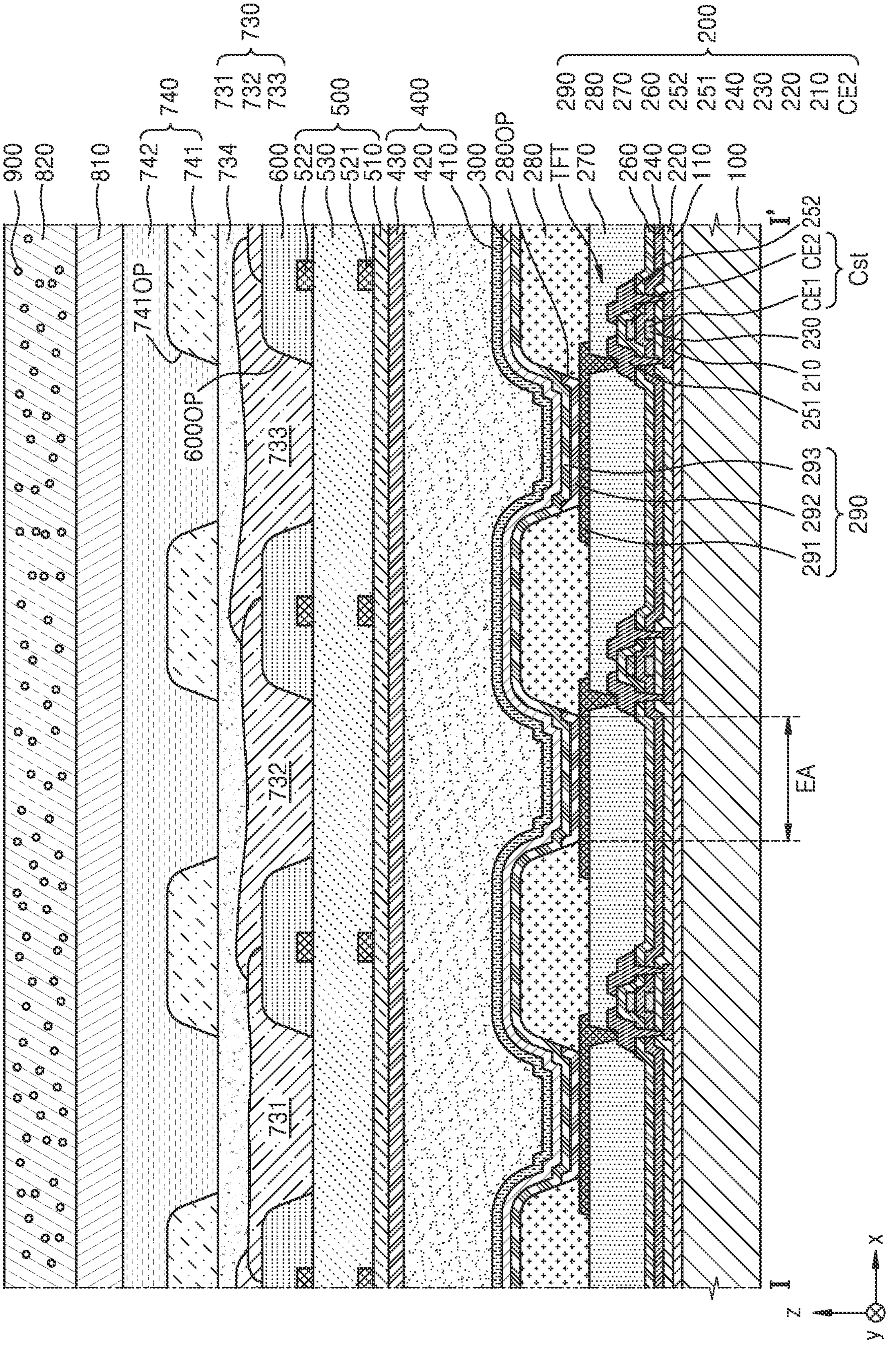
FIG. 12 is a schematic cross-sectional view illustrating a portion of a display apparatus according to an embodiment.

As illustrated in each of FIGS. 11 and 12, which are schematic cross-sectional view illustrating a portion of the display apparatus 1 according to an embodiment, the display apparatus 1 may include an adhesive layer 810 and a protection layer 820. For example, the adhesive layer 810 may cover (overlap in a plan view) the second high-refraction layer 742, and the protection layer 820 may be disposed on the adhesive layer 810. The adhesive layer 810 may include, for example, a silicon-based adhesive material or a urethane-based adhesive material. The protection layer 820 may include a plastic film, for example, polyethylene terephthalate. However, the disclosure is not limited thereto.

As illustrated in FIGS. 11 and 12, the scattering particles 900 may be dispersed and disposed in the adhesive layer 810 or the protection layer 820. Because the scattering particles 900 are disposed over the display element 290, the scattering particles 900 may prevent or minimize the degradation of the display quality of the display apparatus 1 by scattering the light generated from the emission layer, reflected from the pixel electrode 291, and propagating to the outside. For example, the light generated from the emission layer of the intermediate layer 292 may propagate to the outside at different angles according to the inclination degree of each pixel electrode 291. The light propagating to the outside may be scattered by the scattering particles 900 after reaching the adhesive layer 810 or the protection layer 820 disposed over the pixel electrode 291. Accordingly, because the light generated from the emission layer, reflected from the pixel electrode 291, and propagating to the outside is scattered, the user may not visually recognize any color band due to reflection from the pixel electrode 291 or the perception of a color band may be minimized.

Although FIGS. 11 and 12 illustrate that the scattering particles 900 are dispersed and disposed in the adhesive layer 810 or the protection layer 820 of the display apparatus 1 including the color filter layer 730 and the color filter planarization layer 734 without including the first refraction layer 710 and the reflection adjusting layer 720, the disclosure is not limited thereto. For example, even when the display apparatus 1 includes the first refraction layer 710 or the reflection adjusting layer 720 and does not include the color filter layer 730 and the color filter planarization layer 734, the scattering particles 900 may be dispersed and disposed in the adhesive layer 810 or the protection layer 820 of the display apparatus 1. The adhesive layer 810 may be disposed on the first refraction layer 710 or the second refraction layer 740.

Moreover, although FIGS. 11 and 12 illustrate that the display apparatus 1 includes the second refraction layer 740, the disclosure is not limited thereto. For example, even when the display apparatus 1 does not include the second refraction layer 740, the scattering particles 900 may be dispersed and disposed in the adhesive layer 810 or the protection layer 820 of the display apparatus 1.

According to an embodiment described above, a display apparatus capable of reducing the occurrence of a color band due to reflection from an electrode of a display element or the like may be implemented. However, the scope of the disclosure is not limited to these effects.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims.

What is claimed is:

1. A display apparatus comprising:

a display element over a substrate;

a light blocking layer over the display element, the light blocking layer including an opening corresponding to the display element;

a color filter layer filling the opening of the light blocking layer;

a color filter planarization layer overlapping the color filter layer in a plan view;

a low-refraction layer over the color filter planarization layer, the low-refraction layer including an opening corresponding to the display element;

a high-refraction layer filling the opening of the low-refraction layer, the high-refraction layer including high-refraction particles having an average diameter of about 20 nm to about 30 nm; and scattering particles over the display element, wherein the scattering particles are in the high-refraction layer.

2. The display apparatus of claim 1, wherein the scattering particles are in the color filter layer.

3. The display apparatus of claim 1, wherein the scattering particles are in the color filter planarization layer.

4. The display apparatus of claim 1, wherein an average diameter of the scattering particles is about 0.8 μm to about 3.0 μm.

5. The display apparatus of claim 1, wherein the high-refraction layer has a refractive index that is higher than a refractive index of the low-refraction layer.

6. A display apparatus comprising:

a display element over a substrate;

a light blocking layer over the display element, the light blocking layer including an opening corresponding to the display element;

a color filter layer filling the opening of the light blocking layer;

a color filter planarization layer overlapping the color filter layer in a plan view;

an encapsulation layer between the display element and the light blocking layer;

an input sensing layer between the encapsulation layer and the light blocking layer, the input sensing layer including a sensing electrode and a touch insulating layer; and scattering particles in the touch insulating layer.

* * * * *